United States Patent
Kim

(10) Patent No.: US 9,520,429 B2
(45) Date of Patent: Dec. 13, 2016

(54) IMAGE SENSOR WITH PROTECTION LAYER HAVING CONVEX-SHAPED PORTIONS OVER THE AIR SPACERS BETWEEN THE PLURALITY OF FILTERS

(71) Applicant: SK hynix Inc., Gyeonggi-do (KR)

(72) Inventor: Sang-Sik Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/663,146

(22) Filed: Mar. 19, 2015

(65) Prior Publication Data

US 2016/0172398 A1    Jun. 16, 2016

(30) Foreign Application Priority Data

Dec. 15, 2014 (KR) .................. 10-2014-0180224

(51) Int. Cl.
*H01L 27/146*    (2006.01)

(52) U.S. Cl.
CPC ... *H01L 27/14621* (2013.01); *H01L 27/14627* (2013.01); *H01L 27/14645* (2013.01); *H01L 27/14685* (2013.01)

(58) Field of Classification Search
CPC .............. H01L 27/14623; H01L 27/14627; H01L 27/14643; H01L 27/14685
See application file for complete search history.

(56) References Cited

U.S. PATENT DOCUMENTS

2012/0086093 A1    4/2012    Otsuka et al.
2013/0077090 A1    3/2013    Ahn

FOREIGN PATENT DOCUMENTS

KR    1020070069355    7/2007

*Primary Examiner* — Thanh V Pham
(74) *Attorney, Agent, or Firm* — I P & T Group LLP

(57) ABSTRACT

An image sensor includes a plurality of filters, an air spacer formed between the plurality of filters, and a protection layer including a first part formed on the plurality of filters and a second part formed on the air spacer. The second part of the protection layer may have a convex lens shape that protrudes over the plurality of filters.

9 Claims, 5 Drawing Sheets

IMAGE SENSOR WITH PROTECTION LAYER HAVING CONVEX-SHAPED PORTIONS OVER THE AIR SPACERS BETWEEN THE PLURALITY OF FILTERS

CROSS-REFERENCE TO RELATED APPLICATIONS

The present document claims priority of Korean Patent Application No. 10-2014-0180224, entitled "IMAGE SENSOR AND METHOD FOR FABRICATING THE SAME" and filed on Dec. 15, 2014, which is incorporated herein by reference in its entirety.

BACKGROUND

Exemplary embodiments of the present disclosure relate to fabrication technology for a semiconductor device and, more particularly, to an image sensor having a self-aligned submicro lens and a fabricating method thereof.

An image sensor is a device that converts an optical image into an electric signal. With the developments of the computer industry and the communication industry, an image sensor with improved performance is demanded in various fields such as digital cameras, camcorders, PCSs (personal communication system), game machines, security cameras, medical micro cameras, robots, etc.

SUMMARY

Various embodiments are directed to an image sensor with high performance and a fabricating method thereof.

In an embodiment, an image sensor may include a plurality of filters, an air spacer formed between the plurality of filters, a protection layer including a first part formed on the plurality of filters and a second part formed on the air spacer, wherein the second part of the protection layer may have a shape of a convex lens which protrudes over the plurality of filters. In an embodiment, the image sensor may further include micro lenses formed on a first part of a protection layer to correspond to the plurality of filters, respectively.

In an embodiment, the micro lens may have the same refractive index as a protection layer, or a lower refractive index than a protection layer. The micro lenses may be separated from one another by the second part of the protection layer. Each of the plurality of filters may include a single filter selected from the group consisting of a red filter, a green filter, a blue filter, a cyan filter, a yellow filter, a magenta filter, a white filter, a black filter, an infrared pass filter, an infrared cutoff filter and a band pass filter passing a determined bandwidth, or a multi-filter which includes two or more filters selected from the group. The plurality of filters may have a higher refractive index than the air spacer. The air spacer may have a mesh shape. The protection layer may have a lower refractive index than the plurality of filters, or a higher refractive index than the air spacer. The protection layer may include a thermosetting material.

In an embodiment, a method for fabricating an image sensor may include forming sacrificial patterns on a substrate, forming a plurality of filters to be filled between the sacrificial patterns on the substrates removing the sacrificial patterns and forming an air spacer between the plurality of filters, forming a protection layer on a whole surface of a structure including the plurality of filters and the air spacer expanding an air in the air spacer and transforming the protection layer formed on the air spacer into a shape of a convex lens, and forming micro lenses on the protection layer, corresponding to the plurality of filters.

The expanding of the air in the air spacer and the transforming of the protection layer may include a heat treatment process such as annealing. In an embodiment, in the forming of the plurality of filters, surfaces of the plurality of filters may be mutually planar. The sacrificial patterns and the air spacer may have a form of a mesh. The plurality of filters may be formed to have a higher refractive index than the air spacer. Each of the plurality of filters may include a single filter selected from the group consisting of a red filter, a green filter, a blue filter, a cyan filter, a yellow filter, a magenta filter, a white filter, a black filter, an infrared pass filter, an infrared cutoff filter and a band pass filter passing a determined bandwidth, or a multi-filter which includes two or more filters selected from the group. The protection layer may have a lower refractive index than the plurality of filters, and a higher refractive index than the air spacer, The protection layer may include a thermosetting material. The micro lenses may be formed to have the same refractive index as the protection layer, or a lower refractive index than the protection layer. The micro lenses may be separated from one another by the protection layer having the shape of the convex lens.

Disclosed embodiments may have an air spacer formed between the plurality of filters, and may prevent optical crosstalk. Furthermore, a second part of the protection layer which expands the air spacer vertically may prevent optical crosstalk more effectively. The prevention of optical crosstalk may improve the signal-to-noise ratio of an image sensor.

In addition, the second part of the protection layer may prevent the edges of adjacent micro lenses from overlapping, and prevent optical loss due to a space between the micro lenses.

As a result, an air spacer and a protection layer may improve the performance of an image sensor.

DETAILED DESCRIPTION

Figure 1:
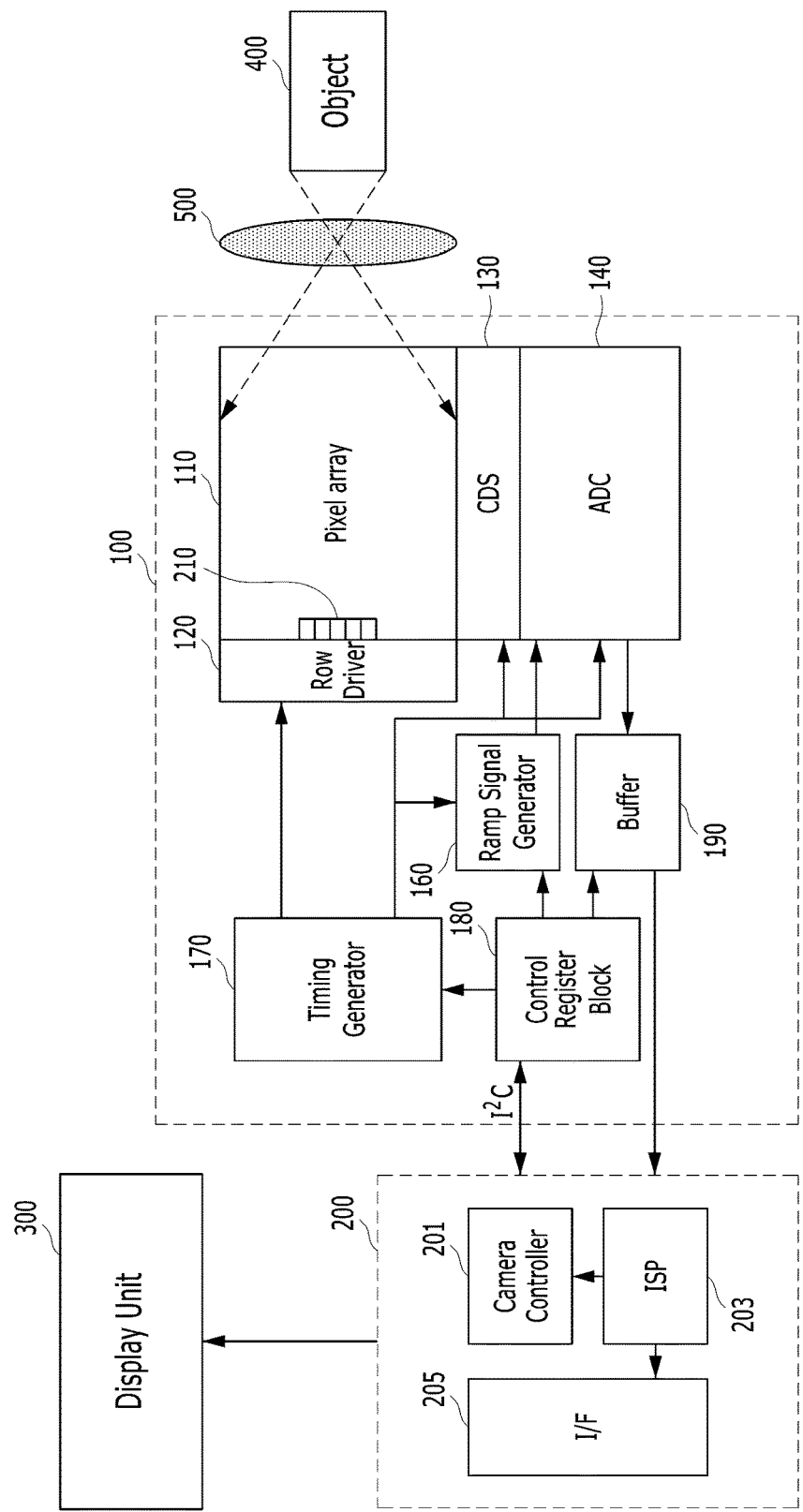
FIG. 1 is a schematic block diagram of an image process system including pixel arrays according to an exemplary embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. When a first layer is referred to as being "on" a second layer or "on" a substrate, it not only refers to where the first layer is formed directly on the second layer or the substrate but also to where a third layer exists between the first layer and the second layer or the substrate.

Embodiments of the present disclosure described below provide an image sensor with high performance and a fabricating method thereof. In detail, an image sensor in accordance with the embodiments of the present disclosure may prevent crosstalk to improve its signal-to-noise ratio, prevent edges of micro lenses from overlapping, and minimize optical loss due to space between micro lenses.

An image sensor is a semiconductor device that converts an optical image into an electric signal. It may be classified as a CCD (charge coupled device) image sensor or a CMOS (complementary metal oxide semiconductor) image sensor. A CMOS image sensor has advantages in that its driving system is relatively simple and various scanning methods may be used compared to a CCD image sensor. In addition, the circuitry that processes signals from pixels may be integrated into a single chip by the CMOS manufacturing process. Therefore, the size of the product may be minimized, and the manufacturing cost may be reduced, and reduced power consumption may be achieved. Accordingly, there is currently a lot of research and development on CMOS image sensors. A CMOS image sensor may be classified as a front-side illumination type or a back-side illumination type. The back-side illumination type may have more advanced operation characteristics (e.g., sensitivity) compared to the front-side illumination type. Accordingly, a CMOS image sensor with back-side illumination will be used as examples for the embodiments of the present invention.

FIG. 1 is a schematic block diagram of an image process system including pixel arrays according to an embodiment of the present disclosure.

As shown in FIG. 1, an image process system may include an image sensor 100, a digital signal processor (DSP) 200, a display unit 300 and a lens module 500.

The image sensor 100 may include a pixel array 110, a row driver 120, a correlated double sampling (CDS) block 130, an analog-digital converter (ADC) block 140, a ramp signal generator 160, a timing generator 170, a control register block 180 and a buffer 190. A pixel array 110 may include a plurality of pixels 210 having an air spacer 607 and a protection layer 108 shown in FIG. 2 according to an exemplary embodiment of the present invention. A plurality of pixels 210 will be described in more detail, referring to FIG. 2.

The image sensor 100 detects an optical image of an object 400, which is taken through a lens module 500, by control of a digital signal processor 200. The digital signal processor 200 may output an image, which is detected by the image sensor 100, to a display unit 300. A display unit 300 is a device which may display the image outputted from the digital signal processor 200. For example, the display unit 300 may be a computer, a mobile communication device, and terminals of other image output devices.

The digital signal processor 200 may include a camera controller 201, an image signal processor (ISP) 203, and an interface 205. The camera controller 201 may control the operation of the control register block 180. The camera controller 201 may control the image sensor 100 by using, for example but not limited to, an I²C (inter-integrated circuit). The image signal processor 203 may receive an image (or an image data), process the received image for human recognition, and output the processed image through the interface 205 to the display unit 300.

FIG. 1 shows that the image signal processor 203 is located in the digital signal processor 200. However, according to various embodiments, the image signal processor 203 may be located in the image sensor 100. In addition, the image sensor 100 and the image signal processor 203 may be implemented in a single package, for example, a multichip package (MCP).

Figure 2:
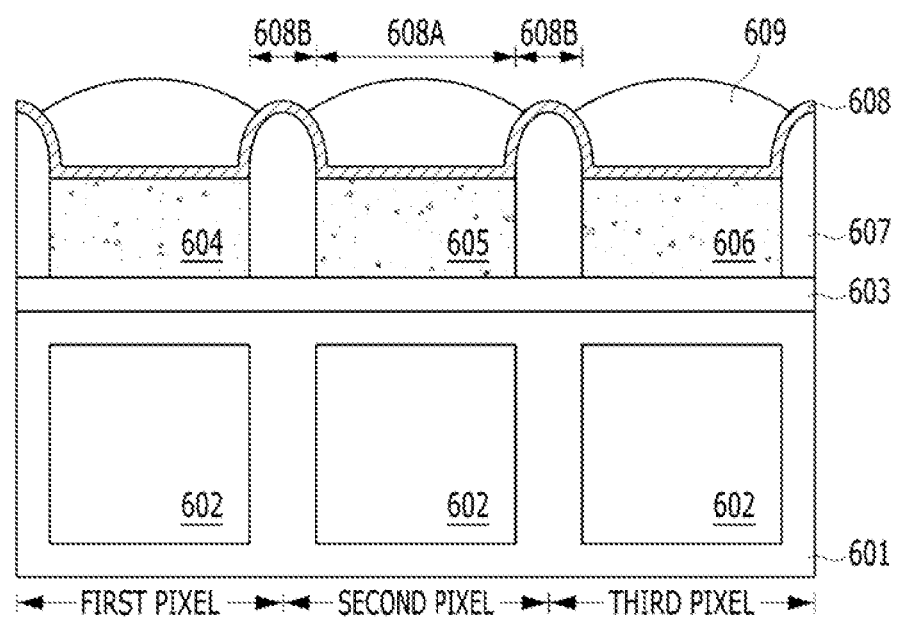
FIG. 2 is a cross section showing an image sensor according to an exemplary embodiment.

FIG. 2 is a cross section showing an image sensor according to an embodiment of the present disclosure. In particular, FIG. 2 is a cross section that shows a plurality of pixels which are included in a pixel array in an image sensor shown in FIG. 1 according to the embodiments of the present disclosure.

As shown in FIG. 2, an image sensor may include a substrate 601 on which a structure is formed, wherein the structure has a plurality of pixels and a photoelectric conversion element 602 formed in each of the plurality of pixels, a buffer layer 603 formed on the substrate 601, a plurality of filters 604, 605, and 606 formed on the buffer layer 603, air spacer 607 formed between the plurality of filters 604, 605, and 606, a protection layer 608 including a first part 608A formed on the plurality of filters 604, 605, and 606 and a second part 6086 formed on the air spacer 607, the second part having a shape of a convex lens, and a micro lens 609 formed on the protection layer 608 corresponding to the plurality of filters 604, 605, and 606. Although there are three pixels in FIG. 2, this is merely an example.

A plurality of pixels may include a first pixel, a second pixel and a third pixel which generate photo electrons in response to incident lights with different bandwidths. For example, the first pixel, the second pixel and the third pixel may be a red pixel, a green pixel and a blue pixel, respectively. Alternatively, the first to third pixels may be replaced with one selected from the group consisting of a cyan pixel, a yellow pixel, a magenta pixel, a white pixel, a black pixel and an infrared pixel.

The substrate 601 may include a semiconductor substrate. A semiconductor substrate may be in a single crystal state, and may include a Si-containing material. That is, the substrate 601 may include a monocrystalline Si-containing material. The photoelectric conversion element 602 may include a plurality of photoelectric conversion portions (not shown) overlapping up and down. Each of the photoelectric conversion portions may be a photodiode including an N-type impurity region and a P-type impurity region. In addition, the photoelectric conversion element 602 may include an organic photoelectric conversion layer (not shown) formed on the substrate 601. The structure formed on the substrate 601, including the photoelectric conversion element 602, may be a signal generating circuit. A signal generating circuit may generate (or output) an electric signal corresponding to a photoelectron generated in the photoelectric conversion element 602.

The buffer layer 603 formed on the substrate 601 may function as a planarization layer eliminating topology differences due to the structure formed on the substrate 601 and as a reflection prevention layer against incident light. The buffer layer 603 may be a single layer or multiple layers in which two or more layers are laminated, selected from the group consisting of an oxide layer a nitride layer, and an oxynitride layer.

The plurality of filters 604, 605, 606 formed on the buffer layer 603 corresponding to a plurality of pixels, respectively, each provides a photoelectric conversion element 602 with incident light having a bandwidth required by the corresponding pixel. In particular, color separated incident light, which is required by the respective pixels, may be provided to the photoelectric conversion element 602 by using the plurality of filters 604, 605, and 606. The plurality of filters 604, 605, and 606 may include color filters. The plurality of filters 604, 605, and 606 may include a single filter or multiple filters, selected from the group consisting of a red filter, a green filter, a blue filter, a cyan filter, a yellow filter, a magenta filter, a white filter, a black filter, an infrared pass filter, an infrared cutoff filter, and a band pass filter which passes a determined bandwidth. For example, when the first pixel, the second pixel, and the third pixel are a red pixel, a green pixel, and a blue pixel, the first filter 604, the second filter 605, and the third filter 606 may be a red filter, a green filter, and a blue filter, respectively.

The plurality of filters 604, 605, and 606 may have mutually planar surfaces or mutually planar upper surfaces. In particular, the plurality of filters 604, 605, and 606 may have the same thickness. When the thicknesses of the plurality of filters are different from each other, a planarization layer (not shown) may be additionally formed on the plurality of filters 604, 605, and 606 to eliminate topology differences therebetween. The plurality of filters 604, 605, and 606 may be spaced apart from each other in a matrix form. The air spacer 607 may be formed between the plurality of filters 604, 605, and 606 which are spaced apart. Accordingly, the air spacer 607 may be formed corresponding to the boundaries of a plurality of pixels, and may form a mesh. The air spacer 607 may prevent optical crosstalk and improve the sensor's signal-to-noise ratio. For this purpose, the plurality of filters 604, 605, and 606 may have a higher refractive index than the air spacer 607. That is, the plurality of filters 604, 605, and 606 may have a higher refractive index than the air.

The protection layer 608, which covers the whole surface of the structure including the plurality of filters 604, 605, and 606 and the air spacer 607, may include the first part 608A formed on the plurality of filters 604, 605, and 606 and the second part 608B formed on the air spacer 607. The protection layer 608 of the first part 608A may function as a reflection prevention layer for the plurality of filters 604, 605, and 606, and the protection layer 608 of the second part 608B may prevent the edges of adjacent micro lenses 609 from overlapping, and prevent optical loss from the space between the micro lenses 609. For this purpose, the protection layer 608 of the first part 608A may have a planar shape, and the protection layer 608 of the second part 608B may have a convex lens shape that protrudes over the plurality of filters 604, 605, and 606. The protection layer 608 may have a lower refractive index than the plurality of filters 604, 605, and 606 and may have a higher refractive index than the air spacer 607, i.e., the air. The protection layer 608 may include a thermosetting material.

The micro lens 609 formed on the first part 608A of the protection layer 608, corresponding to the plurality of filters 604, 605, and 606, may have a hemisphere shape. The edges of micro lenses 609 are in contact with the second part 608B of the protection layer 608, and are separated from each other by the second part 608B of the protection layer 608. The micro lens 609 may have the same refractive index as or a lower refractive index than the protection layer 608.

An image sensor according to the aforementioned embodiments may have the air spacer 607 formed between the plurality of filters 604, 605, and 606 and prevent optical crosstalk. In addition, the second part 608B of the protection layer 608, which expand the air spacer 607 vertically, may prevent optical crosstalk more effectively. The prevention of optical crosstalk may improve the signal-to-noise ratio of an image sensor.

In addition, the second part 608B of the protection layer 608 may prevent the edges of the adjacent micro lenses 609 from overlapping, and prevent optical loss due to the space between micro lenses 609.

As a result, an image sensor according to exemplary embodiments of the present disclosure has an air spacer 607 and a protection layer 608, with improved performance.

FIGS. 3A to 3E are cross sections showing the fabrication of an image sensor according to an exemplary embodiment of the present disclosure.

Figure 3A:
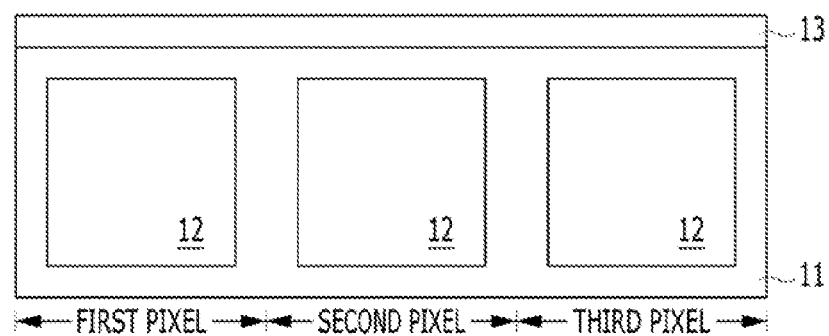
FIGS. 3A to 3E are cross sections showing processes for fabricating an image sensor according to an exemplary embodiment.
Figure 3B:
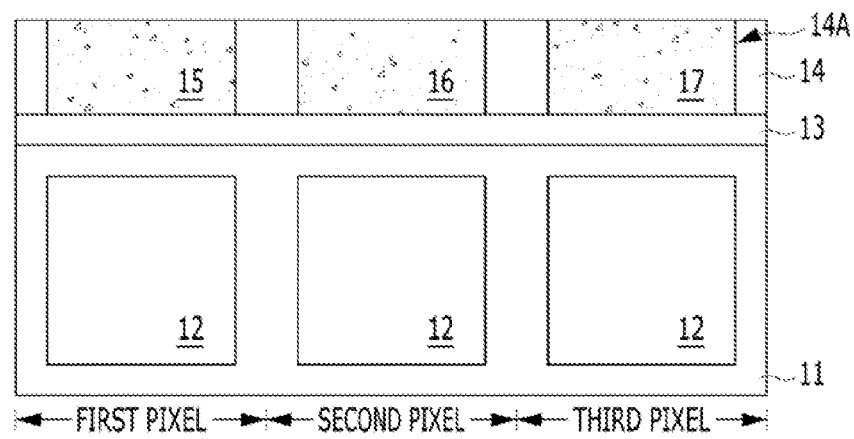

As shown in FIG. 3A, a structure including a photoelectric conversion element 12 is formed on a substrate 11 having a plurality of pixels, for example, a first pixel, a second pixel and a third pixel. The first pixel, the second pixel and the third pixel may be a red pixel, a green pixel and a blue pixel, respectively. A photoelectric conversion element 12 may include a photodiode. The structure may include signal generating circuitry including a plurality of transistors, multiple layers of metal wirings and a plurality of plugs interconnecting them.

Next, a buffer layer 13 is formed on the substrate 11 on which a structure including the photoelectric conversion element 12 has been formed. The buffer layer 13 functions as a planarization layer eliminating the topology differences due to the structure formed on the substrate 11 and functions as a reflection prevention layer. The buffer layer 13 may be formed by an insulating layer. For example, the buffer layer 13 may be formed by a single layer or multiple layers in which two or more layers are laminated, selected from the group consisting of an oxide layer, a nitride layer, and oxynitride layer.

As shown in FIG. 38, a sacrificial pattern 14 is formed on the buffer layer 13. The sacrificial pattern 14 may include an open portion 14A defining the space in which a plurality of filters 15, 16, and 17 are to be formed. The sacrificial pattern 14 may include a material having a selectivity with respect to the plurality of filters 15, 16, and 17 which are to be formed in the subsequent processes. For example, the sacrificial pattern 14 may be formed with a photoresist pattern. Accordingly, the sacrificial pattern 14 may be formed by applying the photoresist on the entire surface of the buffer layer 13 followed by an exposure process and a developing process.

The sacrificial pattern 14 may be formed along the edges of a plurality of pixels, and form a mesh. A width of the sacrificial pattern 14 may control the width of an air spacer to be formed in the following processes. The height of the sacrificial pattern 14 may be the same as or higher than those of the plurality of filters 15, 16, and 17 to be formed in the following processes.

Next, the plurality of filters 15, 16, and 17, which are filled in the open portion of the sacrificial pattern 14, are formed. That is, the first filter 15, the second filter 16 and the third filter 17 are formed subsequently, which correspond to the first pixel, the second pixel and the third pixel, respectively. The plurality of filters 15, 16, and 17 may be color filters. For example, the first filter 15, the second filter 16 and the third filter 17 may be a red filter, a green filter and a blue filter, respectively.

The plurality of filters 15, 16, and 17 may have the same thickness (or height), or different thicknesses. When the plurality of filters 15, 16, and 17 have different thicknesses, a planarization layer (not shown) may be formed on the plurality of filters 15, 16, and 17 so that the plurality of filters 15, 16, and 17 may have mutually planar surfaces.

Figure 3C:
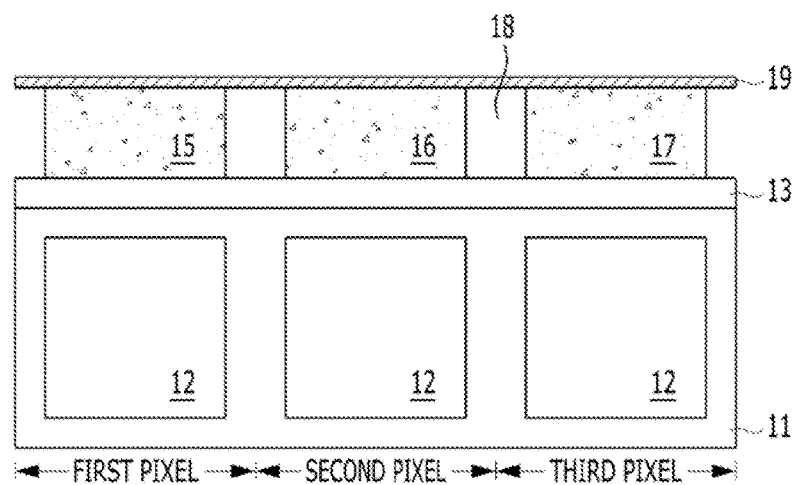

As shown in FIG. 3C, an air spacer 18 is formed between the plurality of filters 15, 16, and 17 by removing the sacrificial pattern 14. The sacrificial pattern 14 may be formed by a photoresist pattern and removed by an ashing process. The air spacer 18, which is formed by removing the sacrificial pattern 14, may be formed along the edges of a plurality of pixels, and may have a mesh shape.

Next, a protection layer 19 is formed on the entire surface of the structure including the plurality of filters 15, 16, and 17 and the air spacer 18. The protection layer 19 is not filled between the plurality of filters 15, 16, and 17, that is, in the air spacer 18. The protection layer 19 may have a lower refractive index than the plurality of filters 15, 16, and 17 and a higher refractive index than the air spacer 18. The protection layer may be formed of a thermosetting material.

Figure 3D:
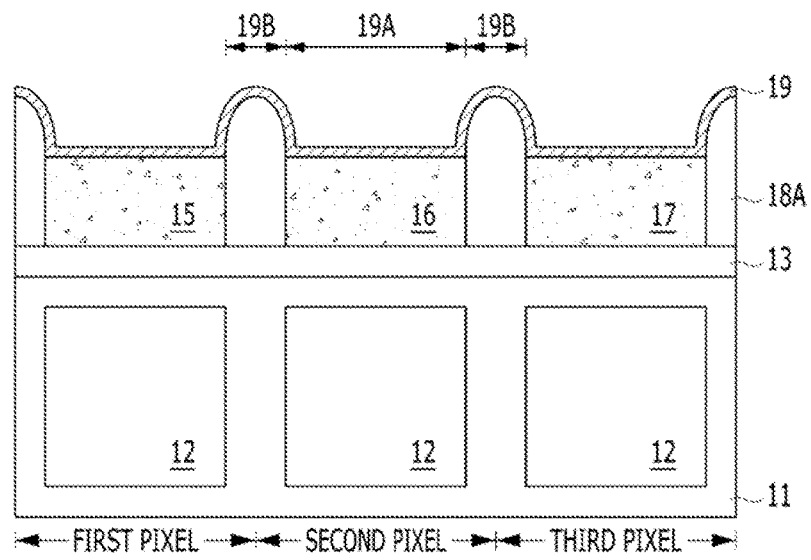

As shown in FIG. 3D, annealing is accomplished so that the air in the air spacer 18 is expanded and the protection layer 19 on the air spacer 18 is transformed into the shape of the convex lens. Annealing may be accomplished in such a temperature range that the shape of the thermosetting protection layer 19 can be transformed. Hereinafter, the reference numeral of the expanded air spacer 18, which was expanded through an annealing process, will be changed to 18A.

By annealing, the first part 19A of the protection layer 19 formed on the plurality of filters 15, 16, and 17 may have a planar in shape, and the second part 19B of the protection layer 19 formed on the air spacer 18A may have the shape of a convex lens and protrude over the plurality of filters 15, 16, and 17. Through this, optical crosstalk may be prevented more effectively. The protection layer 19 is thermosetting, and the second part 19B of the protection layer 19 may maintain the shape of a convex lens after annealing.

Figure 3E:
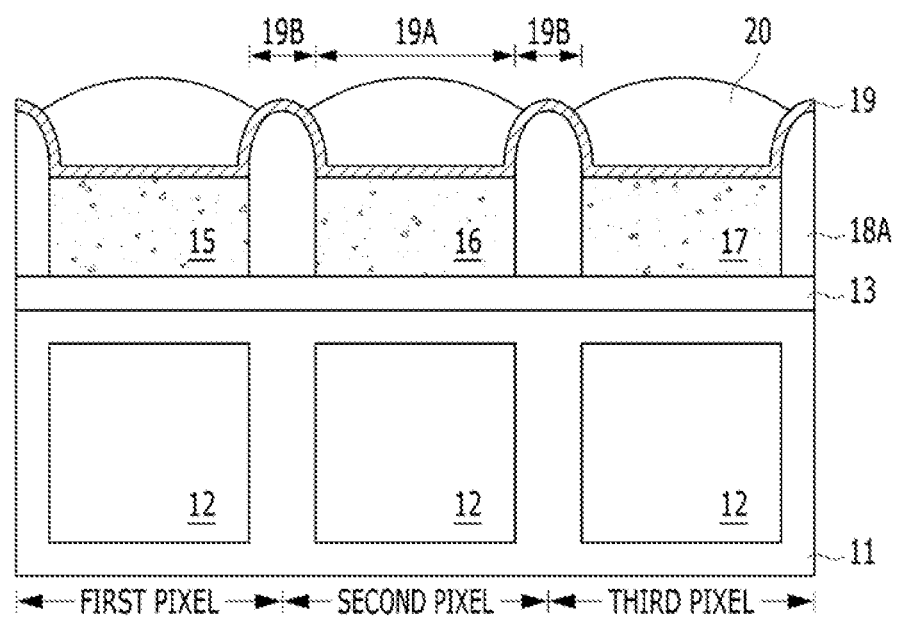

As shown in FIG. 3E, a micro lens 20 is formed on the first part 19A on the protection layer 19 corresponding to each of the plurality of filters 15, 16, and 17. A micro lens 20 may be formed to have the same refractive index as the protection layer 19 or a lower refractive index than the protection layer 19.

In forming the micro lens 20, a lens pattern may be formed on the protection layer 19 and then a reflow process may be performed so that the micro lens 20 may have a predetermined curvature. The second part 19B of the protection layer 19 may function as a separation layer to prevent the edges of adjacent micro lenses 20 from overlapping. Furthermore, a plurality of micro lenses may be formed to have a uniform curvature. Although the second part 19B of the protection layer 19 functions as a separation layer between the micro lenses 20, the second part 195 of the protection layer 19 has the shape of a convex lens and optical loss due to the space between the micro lenses 20 may be prevented.

Thereafter, an image sensor may be fabricated according to semiconductor manufacturing methods that are currently well known through the industry.

Although various embodiments have been described for illustrative purposes, it will be apparent to those skilled in the art that various changes and modifications may be made without departing from the spirit and scope of the invention as defined in the following claims.

What is claimed:

1. An image sensor comprising:
    a plurality of filters;
    an air spacer formed between the plurality of filters; and
    a protection layer including a first part formed on the plurality of filters and a second part formed on the air spacer,
    wherein the second part of the protection layer has a convex lens shape which protrudes over the air spacer.

2. The image sensor according to claim 1, further comprising:
    micro lenses formed on the first part of the protection layer to correspond to the plurality of filters, respectively.

3. The image sensor according to claim 2, wherein the micro lens has the same refractive index as the protection layer, or a refractive index lower than the protection layer.

4. The image sensor according to claim 2, wherein the micro lenses are separated from one another by the second part of the protection layer.

5. The image sensor according to claim 1, wherein each of the plurality of filters includes a single filter selected from a group consisting of a red filter, a green filter, a blue filter, a cyan filter, a yellow filter, a magenta filter, a white filter, a black filter, an infrared pass filter, an infrared cutoff filter and a band pass filter passing a determined bandwidth, or a multi-filter which includes two or more filters selected from the group.

6. The image sensor according to claim 1, wherein the plurality of filters have a higher refractive index than the air spacer.

7. The image sensor according to claim 1, wherein the air spacers have a form of a mesh.

8. The image sensor according to claim 1, wherein the protection layer has a lower refractive index than the plurality of filters and a higher refractive index than the air spacer.

9. The image sensor according to claim 1, wherein the protection layer includes a thermosetting material.

* * * * *